United States Patent [19]

Zehnpfennig et al.

[11] 4,385,434

[45] May 31, 1983

[54] ALIGNMENT SYSTEM

[75] Inventors: Theodore F. Zehnpfennig, Wayland; Giuseppe Aurilio, Arlington, both of Mass.

[73] Assignee: Visidyne, Inc., Burlington, Mass.

[21] Appl. No.: 271,786

[22] Filed: Jun. 8, 1981

[51] Int. Cl.³ .......................... A61K 27/02; H01L 7/00
[52] U.S. Cl. .............................. 29/576 B; 250/492.2
[58] Field of Search ................. 29/577 R, 589, 464, 29/576 B, 576 R; 250/492 A

[56] References Cited

U.S. PATENT DOCUMENTS 3,875,416  4/1975  Spicer ........................ 29/577 X
4,322,626  3/1982  Kawashima .................. 250/492.2

Primary Examiner—L. Dewayne Rutledge
Assistant Examiner—David A. Hey
Attorney, Agent, or Firm—Joseph S. Iandiorio

[57] ABSTRACT

An alignment system for realigning one portion of an integrated circuit wafer relative to another portion of the same wafer including: a support member for mounting a wafer to be realigned and having a plurality of laterally disposed zones; and means for selectively, laterally deforming the zones of the support member for realigning corresponding portions of a wafer mounted on the support member.

20 Claims, 11 Drawing Figures

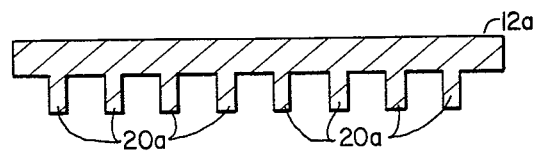
FIG. 6
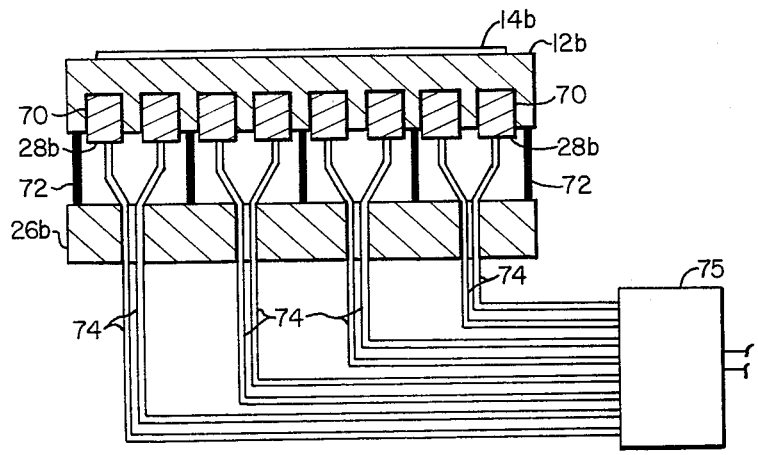
FIG. 7
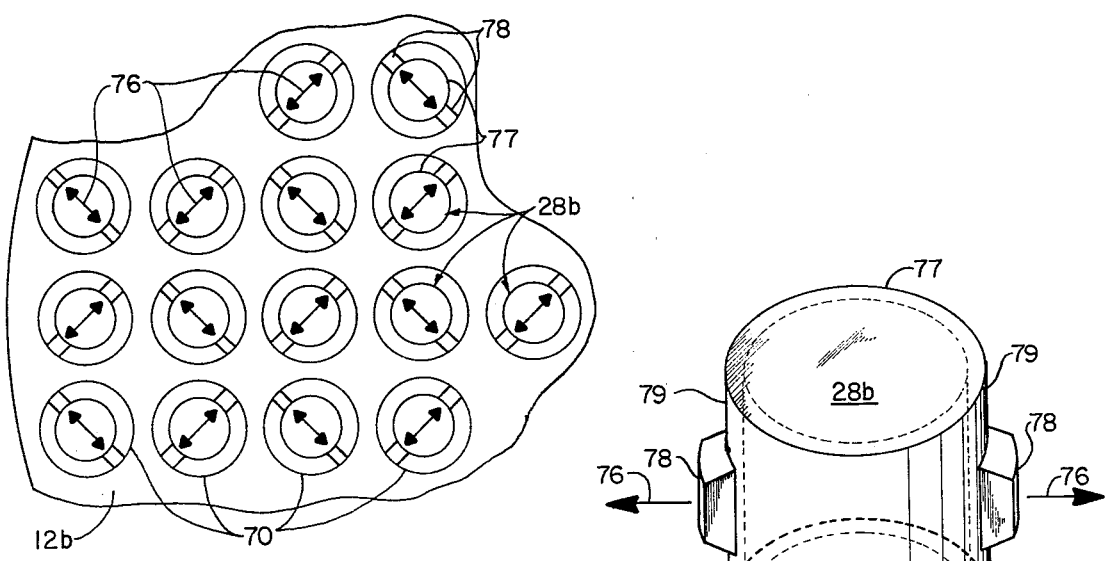
FIG. 8
FIG. 9

ALIGNMENT SYSTEM

FIELD OF INVENTION

This invention relates to an alignment system for realigning one portion of a part relative to another portion of the same part; and more particularly to such a system for realigning portions of an integrated circuit wafer, especially for use in multi-mask proximity microlithography.

BACKGROUND OF INVENTION

X-ray and electron beam lithographic techniques have progressed so that it is now possible, through single-mask lithography, to produce electronic circuits and components having line widths as narrow as 0.2 microns. In addition, conventional mask-to-wafer alignment may be controlled to within a lateral accuracy of about 0.05 microns. By lateral herein is meant in the directions parallel to the plane of the mask or wafer.

Nevertheless, despite these accomplishments it is still not practical to produce multi-mask devices with fractional micron component sizes using X-ray or electron beam lithography, because of a number of sources of error that arise. For example, typically mask substrates must be very thin in order to transmit soft X-rays or electrons with reasonable efficiency. X-ray masks of boron nitride, silicon oxynitride, or polyimide have thicknesses whose range may be a fraction of a micron up to several microns. Mapping of 3-inch and 5-inch boron nitride masks of this type indicates that the average distortion error is 0.2 microns and the maximum error is 0.4 microns. This range of error is one reason that fractional micron feature sizes fabricated on multimask devices have been impractical. In addition, in between each step of a multiple lithographic process, the wafer itself may undergo a number of processes including etching, oxidation, cleaning, vacuum deposition, resist stripping and coating, plating, and diffusion doping at elevated temperatures. Such steps, especially those performed at high heat, may be the source of wafer distortions which would prevent the needed accuracy in sequential exposures through multiple masks with features in the submicron range. Another source of error in the lateral positioning of circuit features is variations in the mask to wafer gap. This may be due to lack of flatness in the wafer, lack of flatness in the mask, or improper alignment between the two during an overlay operation.

SUMMARY OF INVENTION

It is therefore an object of this invention to provide an improved alignment system for realigning one portion of a part relative to another portion of the same part.

It is a further object of this invention to provide such an alignment system for enabling realignment accuracy sufficient for submicron, multimask lithography.

The invention results from the realization that after full macroscopic alignment between a mask and a wafer, further local realignment is required for more accurate registration, and this more accurate registration may be achieved by applying gentle local forces at one or more zones on a support member on which is mounted the wafer to locally deform the member and the wafer or any other part mounted on the member.

This invention features an alignment system for realigning one portion of a part relative to another portion of the same part. There is a support member or platen for mounting a part to be realigned, and it has a plurality of laterally disposed zones. There are means for selectively, laterally deforming the zones of the support member for realigning corresponding portions of a part mounted on the support member. The means for deforming may include drive pins having one end connected with the support member, and means for selectively, laterally driving each of the drive pins for laterally deforming the associated zones. The drive pins and support member may be separate, and the support member may include sockets for receiving the ends of the drive pins. The ends of the drive pins may extend into the sockets and bear laterally on the sockets proximate the midplane of the support member. The means for deforming may include a base member spaced from the support member for supporting the other ends of the drive pins. The means for selectively, laterally driving the drive pins may be disposed between the support member and the base member.

Alternatively, the means for selectively, laterally deforming may include heating means and may further include a truss structure connected with the support member for channeling heat flow along the trusses.

DISCLOSURE OF PREFERRED EMBODIMENT

Other objects, features and advantages will occur from the following description of a preferred embodiment and the accompanying drawings, in which:

FIG. 6 is a cross-sectoal view of an alternative construction of the device of FIGS. 1 and 2;

FIG. 7 is a side elevational view in cross section of a portion of another alignment system according to this invention;

FIG. 8 is a plan view of the underside of the platen of FIG. 7;

FIG. 9 is an axonometric view of an actuator useable in the embodiment of FIGS. 7 and 8;

Figure 1:
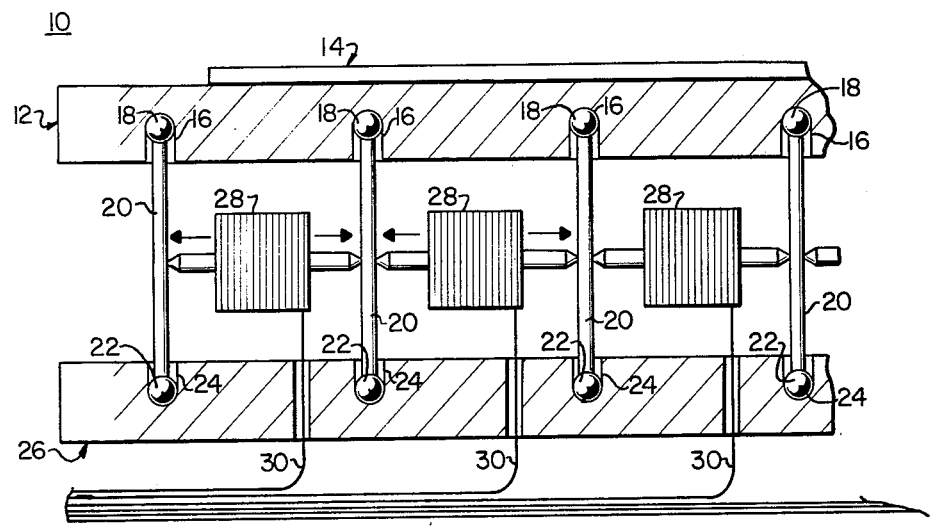
FIG. 1 is a side elevational view in cross section of a portion of an alignment system according to this invention.
Figure 2:
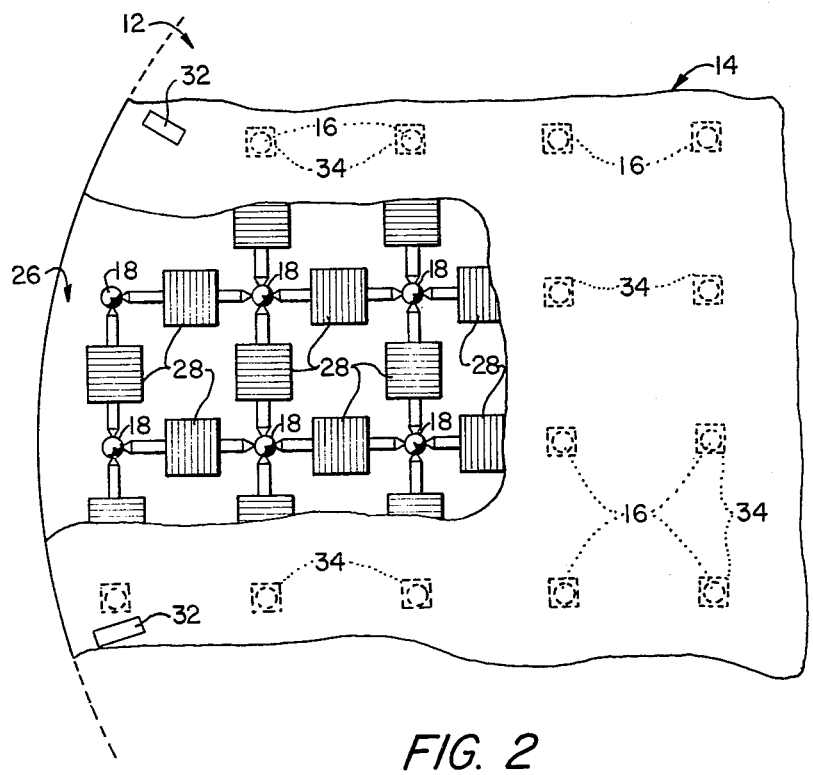
FIG. 2 is a plan view of the system of FIG. 1 with portions broken away.

There is shown in FIGS. 1 and 2 an alignment system 10 according to this invention including a support member or platen 12 on which is mounted, by vacuum, adhesive or other means, a part, for example a silicon wafer, 14. Platen 12 includes a plurality of holes or sockets 16 arranged in a lateral array which receive the spherical ends 18 of pins 20. Sockets 16 are preferably deep enough so that the spherical heads bear on the sides of sockets 16 at approximately the midplane area of platen 12. The lower, spherical ends 22 of pins 20 may be mounted in recesses 24 in base member or plate 26, and piezoelectric actuators 28 are located between plate 26 and platen 12, where they are positioned to bear on neighboring pins on which they can exert force in accordance with voltage supplied to them on lines 30. Although piezoelectric actuators are shown in this preferred embodiment, any type of actuators may be used, e.g. electrical, mechanical, magnetic, hydraulic, pneumatic.

Wafer 14 includes a set of macro-registration marks 32 which may be used to grossly, or macroscopically, align wafer 14 with each successive mask, and a second set of registration marks 34 which may be conveniently placed at the points or nodes on wafer 14 directly above sockets 16, which are used to detect local, lateral misalignments which can be corrected according to this invention.

Figure 3:
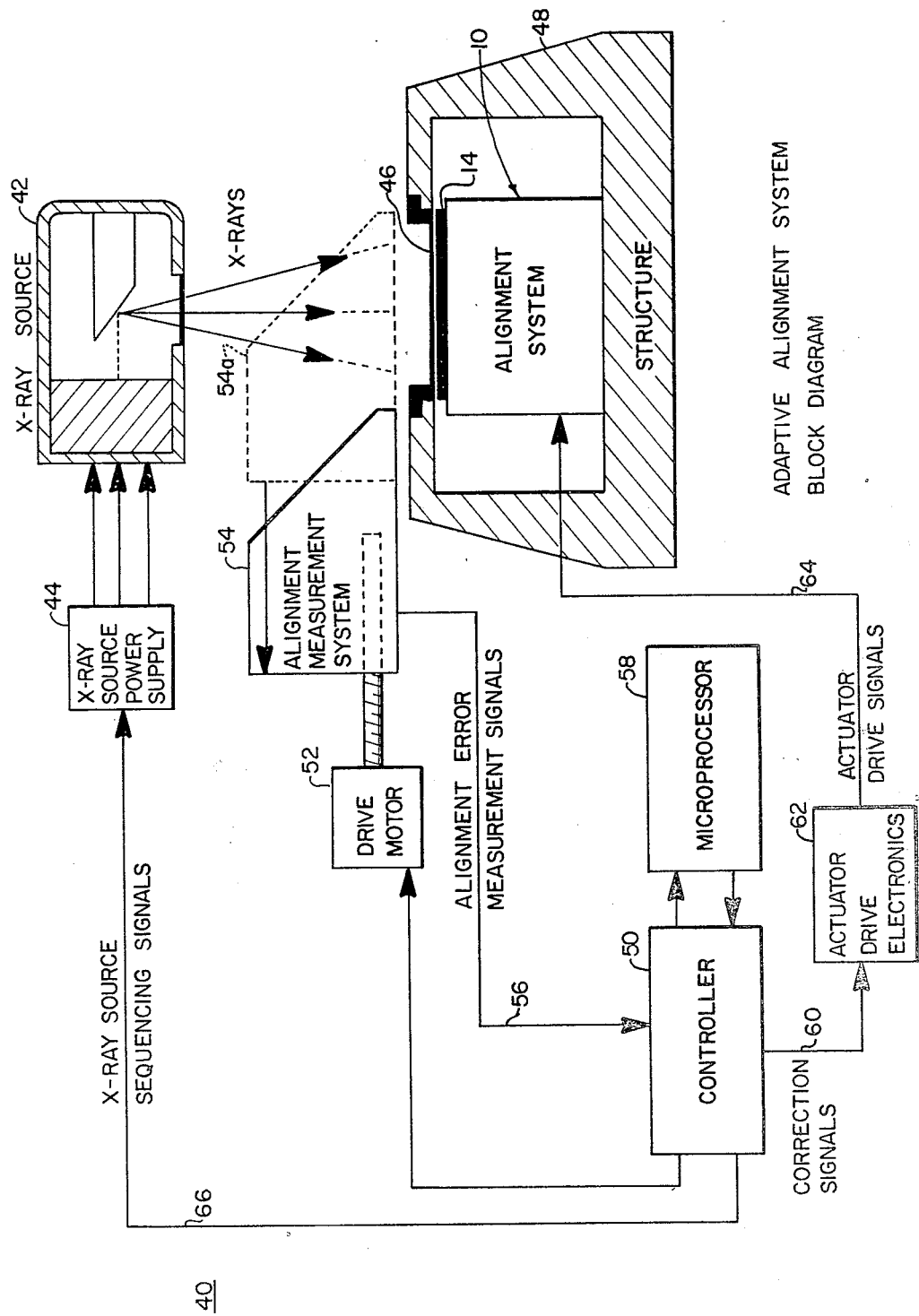
FIG. 3 is a block diagram of an X-ray lithographic system employing the alignment system according to this invention.

Alignment system 10 is used to realign any part mounted on it in the position of wafer 14. Typically it is adapted for use in an electron beam or soft X-ray lithographic system 40, FIG. 3, in which an X-ray source 42 driven by filament and high voltage power supply 44 provides X-rays to expose wafer 14 through mask 46. Mask 46 is supported by a structure 48 in which may be located alignment system 10. Initially, controller 50 operates drive motor 52 to move alignment measurement system 54 to the phantom position shown at 54a, covering mask 46. A macroscopic alignment is effected, whereby mask 46 and wafer 14 are aligned with each other using gross alignment techniques and the first set of macroscopic registration marks 32 in the normal fashion, by some means not shown, whereby the mask and wafer may be grossly aligned with respect to each other. Subsequently the second set of microscopic registration marks 34 are checked. If any one of the marks 34 on wafer 14 is not properly aligned with similar registration marks, not shown, on mask 46, alignment error measurement signals are provided on cable 56 to controller 50. Controller 50 then delivers to microprocessor 58 the error information concerning the particular ones of registration marks 34 that are not in proper alignment with the corresponding registration marks on the mask 46. Forces are computed, depending on the amount of the misalignment, by microprocessor 58, and delivered to controller 50 which generates the correction signals 60 to the actuator drive electronics 62. Actuator drive signals are provided on cable 64 to alignment system 10 to apply those forces to selected ones of piezoelectric actuators 28. When the force pattern imposed by alignment system 10 to wafer 14 is sufficient to correct the misalignment, the error signals on cable 56 cease and controller 50 maintains output of correction signals on cable 60; operates drive motor 52 to recall alignment measurement system 54 to its rest position as indicated in FIG. 3; and enables, via cable 66, the X-ray source power supply 44 so that exposure of wafer 14 through mask 46 can begin.

Thus actuators 28 form a means whereby any one or more of the pins may be selectively, laterally driven to stretch or compress, i.e. deform, platen 12 and wafer 14.

Figure 4:
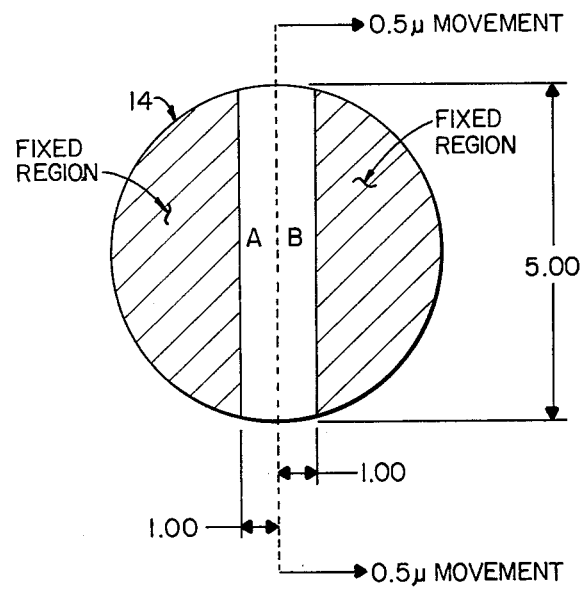
FIG. 4 is a diagrammatic view of a 5-inch wafer illustrating the force required to stretch an entire central region of the wafer.

An example of the forces required is illustrated with respect to FIG. 4, where it is desired to move the center line of a 5-inch diameter, 0.013-inch thick silicon wafer to the right 0.5 microns in FIG. 4, while the cross-hatched regions on either side remain fixed. The force F required to stretch region A may be expressed as $$F = EA\Delta L/L \tag{1}$$

where $\Delta L$ equals the change in length, or 0.5 microns; L equals the length of the region A to be stretched, 1 inch; E equals Young's modulus for silicon, $16.4 \times 10^6$ psi; and A is the cross-sectional area of 0.013 inch $\times$ 5 inches $= 0.065$ inches$^2$ of the part to be stretched. Thus force F is equal to 21 pounds. This is the force required to stretch area A. To simultaneously compress region B as necessary, a total force of 42 pounds would be required. Thus only 42 pounds is required to move the center line of the wafer 0.5 microns along its entire 5-inch diameter. The stress level generated in the silicon is 21 pounds divided by 0.065 inches$^2$, or 320 psi, well below the yield stress of silicon, and so the deformations will all be elastic ones. Since the forces applied by the actuators must deform the platen as well as the wafer, the platen should have as small a lateral stiffness as possible without endangering the mechanical stability of the platen. This can be done by using materials with a relatively low Young's Modulus such as aluminum, magnesium, or fiber-reinforced plastic; or, if materials with higher modulus must be used, then the platen may be hollowed out or honeycombed.

Figure 5:
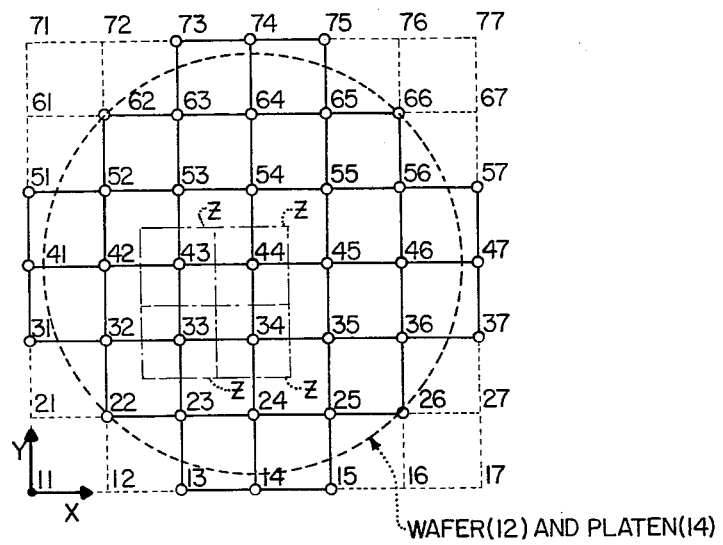
FIG. 5 is a structural model of a wafer and support member with a grid consisting of a finite number of discrete structural elements for analysis.

One method of calculating forces that may be used to drive alignment system 10 to deform the wafer the platen sufficiently to compensate for any misalignment is illustrated with respect to FIG. 5, wherein the phantom circle represents platen 12 and wafer 14, and the solid lines represent discrete structural elements which are used, for purposes of this calculation, as a model of the structural properties of the wafer and platen. These elements are interconnected at nodes identified by two-digit numbers beginning at the lower left at the origin of the X, Y coordinate system, the first digit of which indicates the row and the second digit of which represents the column. The elements are considered connected by flexible pivots at the nodes, which transmit axial loads but not bending moments. The longitudinal stiffness S of any particular element is equal to $F/\Delta L$.

The calculation of the forces needed to produce the required displacements, $\Delta X_{ij}$, $\Delta Y_{ij}$, of the nodes to deform the zone Z associated with each node is accomplished by calculating the change in length $\Delta L$ of each element and the tension in each element, followed by the calculation of the node forces which must be applied to obtain that. For example, the change in length of an element in the X direction connecting any arbitrary nodes ij and in is:

$$\Delta L_{ij,in} = \Delta X_{in} - \Delta X_{ij} \tag{2}$$

where $n = j + 1$. To be specific, the change in length of the element connecting nodes 23 and 24 is $\Delta L_{23,24} = \Delta X_{24} - \Delta X_{23}$. The change of length in an element in the Y direction is similarly calculated, $$\Delta L_{ij,mj} = \Delta Y_{mj} - \Delta Y_{ij} \tag{3}$$

where $m = i + 1$. Since the changes in length are quite small compared to the spacing between the nodes, that is since $\Delta L$ is much smaller than L, these changes may be considered as decoupled. Displacements and forces in the $+X$ direction and $+Y$ direction are designated positive; those in the opposite directions are designated negative. Negative tensions are interpreted as compressive forces.

The tension in an X element connecting nodes ij and in is:

$$\bar{X}_{ij,in} = S_{ij,in} \Delta L_{ij,in} \qquad (4)$$

where $n = j+1$ and $S_{ij,in}$ is the longitudinal stiffness of the element. With regard to the element connecting nodes 23 and 24, the tension is:

$$\bar{X}_{23,24} = S_{23,24} \Delta L_{23,24} \qquad (5)$$

and the tension in a Y element connecting nodes ij and mj is:

$$\bar{Y}_{ij,mj} = S_{ij,mj} \Delta L_{ij,mj} \qquad (6)$$

where $m = i+1$.

The force that must be applied to the node ij to produce the required deformation of the zone in the X direction is equal to the difference between the tension of the elements to the left and the right of this node:

$$F_{x,ij} = \bar{X}_{im,ij} - \bar{X}_{ij,in} \qquad (7)$$

where $m = j-1$ and $n = j+1$.

Thus the force in the X direction applied to node 24 is:

$$F_{x,24} = \bar{X}_{23,24} - \bar{X}_{24,25} \qquad (8)$$

and in the Y direction the force to be applied on node ij is:

$$F_{y,ij} = \bar{Y}_{mj,ij} - \bar{Y}_{ij,nj} \qquad (9)$$

where $m = i-1$ and $n = i+1$.

The above calculations could be performed in a period of a few seconds or less using a microprocessor. Because the linear equations are decoupled, rather than being simultaneous, the usual large-scale matrix inversions needed in most Finite Element Analysis computer operations are not necessary. This greatly decreases the required computing capacity and/or computing time.

The effective stiffness $S_{ij,mn}$ of the various structural elements are constants which can be permanently stored in the microprocessor memory. They can be calculated initially using more sophisticated mechanical structures programs, or they can be measured experimentally on actual wafer/platen assemblies by applying controlled lateral forces and measuring the resulting displacements.

Although thus far the invention has been illustrated with respect to a platen having sockets that receive separate pins, this is not a necessary limitation of the invention. For example, as shown in FIG. 6, where, as with subsequent figures, like parts have been given like numbers and similar parts like numbers accompanied by successive lower case letters with respect to earlier figures, there is shown a platen 12a which has pins 20a that are formed integrally with it.

In another example, shown in cross section in FIG. 7, a plurality of pneumatic or hydraulic actuators 28b are shown installed within cavities 70 formed in the underside of the platen 12b. Pressurized fluid, pneumatic or hydraulic, is supplied to each actuator through tubes 74, which are in turn connected to a variable pneumatic or hydraulic pressure supply system 75, which is analogous to the actuator drive electronics 62 of FIG. 3. The pressure supply system pressurizes each actuator to the level calculated by the microprocessor 58. The platen 12b is connected to the base member 26b by an array of pins 72 which are rigidly attached to both the platen and the base member. The longitudinal stiffness of the pins is sufficient to hold the platen flat and parallel to the base member. However, the pins are thin enough to flex laterally, allowing the various zones of the platen to distort under the influence of the forces produced by the actuators 28b. FIG. 8 is a view of a portion of the underside of the platen 12b, showing the array of actuators 28b installed within the cavities 70. When the various actuators are pressurized, they exert local forces on the platen in various lateral directions, as indicated by the arrows 76. An individual actuator, shown in FIG. 9, consists of a hollow vessel 77 having two raised ridges 78 located on opposite sides of its external surface. These ridges are in contact with the walls of the particular cavity in the platen in which this actuator is located. When pressurized through tube 74, the side walls 79 of the vessel flex outward, causing the raised ridges 78 to exert forces 76 against two opposite regions of the side wall of the cavity, thereby distorting the platen in the desired manner. The actuators may be made rotatable to allow the force application direction to be varied.

Figure 10:
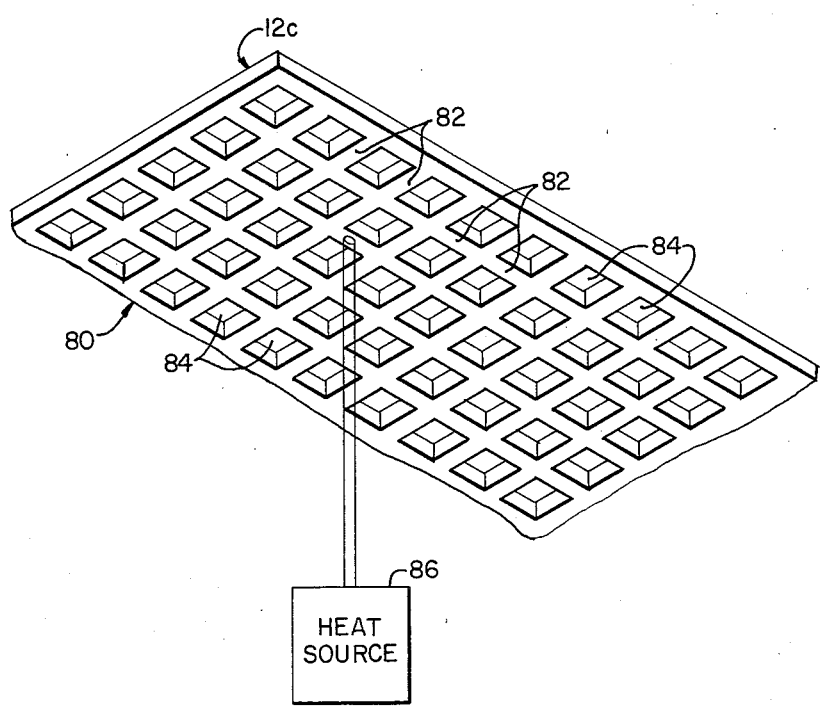
FIG. 10 is an axonometric view with parts broken away of the support member and an alternative source for deforming.
Figure 11:
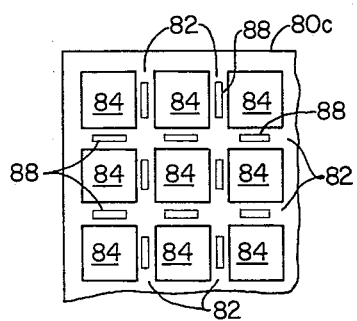
FIG. 11 is a bottom plan view of a portion of the device shown in FIG. 10 with yet another power source used to generate the deforming forces.

Further, although mechanical drives have been illustrated, any other type of drive mechanism may be used. For example, a truss structure 80 may be formed in platen 12c, FIG. 10, having a plurality of beams 82 running in both directions across the bottom of platen 12c separated by holes or bays 84, as shown in FIG. 11. Heat, which may be applied for example by a heat source 86 consisting of a laser beam, may be used to strike selected ones of beams 82 to cause them to expand and deform selected zones on the platen and wafer. The truss structure 80 with bays 84 separating trusses 82 helps to confine the thermal energy paths along the trusses to enable a measure of directionality and control to be exercised over the thermal expansion. Alternatively, heating and cooling may be applied by heaters or Peltier devices applied to or embedded in the truss structure 80c, such as in FIG. 11, wherein heaters 88 are attached directly to trusses 82.

Other embodiments will occur to those skilled in the art and are within the following claims:

What is claimed is:

1. An alignment system for realigning one portion of a part relative to another portion of the same part comprising:

a support member for mounting a part to be realigned and having a plurality of laterally disposed zones; and means for selectively, laterally, deforming said zones of said support member for realigning corresponding portions of a part mounted on said support member.

2. The alignment system of claim 1 in which said means for deforming includes drive pins having one end connected with said support member, and means for selectively, laterally driving each of said drive pins for laterally deforming the associated said zones.

3. The alignment system of claim 2 in which said drive pins and said support member are separate and said support member includes sockets for receiving said ends of said drive pins.

4. The alignment system of claim 3 in which said ends of said drive pins extend into said sockets and bear laterally on said sockets proximate the mid-plane of said support member.

5. The alignment system of claim 2 in which said means for deforming includes a base member, spaced from said support member for supporting said drive pins.

6. The alignment system of claim 5 in which said means for selectively, laterally driving said drive pins is between said support member and said base member.

7. The alignment system of claim 1 in which said means for selectively, laterally deforming includes heating/cooling means.

8. The alignment system of claim 7 in which said means for selectively, laterally deforming includes a truss structure connected with said support member for channeling heat transmission along said trusses.

9. The alignment system of claim 1 in which said means for selectively, laterally deforming includes pressurized fluid actuators disposed in said support member.

10. An alignment system for realigning one portion of a part relative to another portion of the same part comprising:
a support member, for mounting a part to be realigned, and having a plurality of laterally disposed zones and a plurality of sockets in a lateral array;
a plurality of drive pins each having an end engaged with one of said sockets;
a base member, spaced from said support member, for supporting said drive pins in said lateral array; and
means for selectively, laterally driving each of said drive pins for laterally deforming said zones of said support member, and realigning a part mounted thereon.

11. An alignment system for realigning one portion of an integrated circuit wafer relative to another portion of the same wafer comprising:
a support member for mounting a wafer to be realigned and having a plurality of laterally disposed zones; and
means for selectively, laterally, deforming said zones of said support member for realigning corresponding portions of a wafer mounted on said support member.

12. The alignment system of claim 11 in which said means for deforming includes drive pins having one end connected with said support member, and means for selectively, laterally driving each of said drive pins for laterally deforming the associated said zones.

13. The alignment system of claim 12 in which said drive pins and said support member are separate and said support member includes sockets for receiving said ends of said drive pins.

14. The alignment system of claim 13 in which said ends of said drive pins extend into said sockets and bear laterally on said sockets proximate the mid-plane of said support member.

15. The alignment system of claim 12 in which said means for deforming includes a base member, spaced from said support member for supporting said drive pins.

16. The alignment system of claim 15 in which said means for selectively, laterally driving said drive pins is between said support member and said base member.

17. The alignment system of claim 11 in which said means for selectively, laterally deforming includes heating/cooling means.

18. The alignment system of claim 17 in which said means for selectively, laterally deforming includes a truss structure connected with said support member for channeling heat flow along said trusses.

19. The alignment system of claim 11 in which said means for selectively, laterally deforming includes pressurized fluid actuators disposed in said support member.

20. An alignment system for realigning one portion of an integrated circuit wafer relative to another portion of the same wafer comprising:
a support member, for mounting a wafer to be realigned, and having a plurality of laterally disposed zones and a plurality of sockets in a lateral array;
a plurality of drive pins each having an end engaged with one of said sockets;
a base member, spaced from said support member, for supporting said drive pins in said lateral array; and
means for selectively, laterally driving each of said drive pins for laterally deforming said zones of said support member, and realigning a wafer mounted thereon.

* * * * *